US011521944B2

(12) United States Patent
Kitt (10) Patent No.: US 11,521,944 B2
(45) Date of Patent: Dec. 6, 2022

(54) HIGH FREQUENCY / HIGH POWER TRANSITION SYSTEM USING SIW STRUCTURE

(71) Applicant: Qorvo US, Inc., Greensboro, NC (US)

(72) Inventor: John Kitt, Ventura, CA (US)

(73) Assignee: Qorvo US, Inc., Greensboro, NC (US)

( * ) Notice: Subject to any disclaimer, the term of this patent is extended or adjusted under 35 U.S.C. 154(b) by 345 days.

(21) Appl. No.: 16/725,849

(22) Filed: Dec. 23, 2019

(65) Prior Publication Data

US 2020/0211987 A1 Jul. 2, 2020

Related U.S. Application Data

(60) Provisional application No. 62/785,392, filed on Dec. 27, 2018.

(51) Int. Cl.
| | |
|---|---|
| *H01L 23/66* | (2006.01) |
| *H01P 1/208* | (2006.01) |
| *H05K 1/11* | (2006.01) |
| *H01P 5/107* | (2006.01) |
| *H05K 1/14* | (2006.01) |
| *H01L 23/498* | (2006.01) |

(52) U.S. Cl.
CPC ............ *H01L 23/66* (2013.01); *H01P 1/2088* (2013.01); *H01P 5/107* (2013.01); *H05K 1/115* (2013.01); *H05K 1/142* (2013.01); *H05K 1/144* (2013.01); *H01L 23/49866* (2013.01); *H01L 2223/6616* (2013.01); *H01L 2223/6627* (2013.01); *H01L 2223/6683* (2013.01)

(58) Field of Classification Search
CPC ........ H01L 23/66; H01P 1/2088; H01P 5/107; H05K 1/115; H05K 1/142; H05K 1/144

USPC ........................................................ 174/255
See application file for complete search history.

(56) References Cited

U.S. PATENT DOCUMENTS

| | | |
|---|---|---|
| 8,669,834 B2 | 3/2014 | Cheng et al. |
| 2012/0139099 A1* | 6/2012 | Lopez ..................... H01L 23/66 |
| | | 257/728 |

OTHER PUBLICATIONS

Taringou, F. et al., "Substrate-Integrated Waveguide Transitions To Planar Transmission-Line Technologies," 2012 IEEE/MTT-S International Microwave Symposium Digest, Jun. 17-22, 2012, Montreal, QC, Canada, IEEE, 3 pages.

* cited by examiner

*Primary Examiner* — Tremesha S Willis
(74) *Attorney, Agent, or Firm* — Withrow & Terranova, P.L.L.C.

(57) ABSTRACT

The present disclosure relates to a transition system, which includes a monolithic microwave integrated circuit (MMIC) package and a printed-circuit-board (PCB) with a number of PCB vias. The MMIC package has a laminate-based body, which includes a substrate integrated waveguide (SIW) structure with a number of SIW vias, and a MMIC die over the laminate-based body. Herein, the SIW structure faces the PCB and is separate from the PCB with a gap in between. The SIW structure is configured to radiate radio frequency (RF) signals received from the MMIC die to the PCB. An arrangement of the PCB vias is scaling-mirrored to an arrangement of the SIW vias, such that each PCB via and a corresponding SIW via have a same relative position. The arrangement of PCB vias is about aligned with the arrangement of the SIW vias.

21 Claims, 9 Drawing Sheets

HIGH FREQUENCY / HIGH POWER TRANSITION SYSTEM USING SIW STRUCTURE

RELATED APPLICATIONS

This application claims the benefit of provisional patent application Ser. No. 62/785,392, filed Dec. 27, 2018, the disclosure of which is hereby incorporated herein by reference in its entirety.

FIELD OF THE DISCLOSURE

The present disclosure relates to a high frequency/high power transition system, and specifically to a high frequency/high power transition system including a laminate-based monolithic microwave integrated circuit (MMIC) package with a substrate integrated waveguide (SIW) structure, and a printed-circuit-board (PCB). Herein, the SIW structure is configured to transmit radio frequency (RF) signals between the laminate-based MMIC package and the PCB.

BACKGROUND

Laminate-based packages are highly desired for many monolithic microwave integrated circuit (MMIC) applications as a means to protect the MMIC dies from physical harm and to ease their use in assembly. For superior high frequency (>40 GHz) and superior high power (>5 W) MMIC applications, the thermal performance and, consequently, the reliability are critical challenges in laminate-based package designs. As an example, metal structures along the input/output path of the laminate-base package may become very hot due to radio frequency (RF) energy dissipated along the input/output path.

However, microstrip techniques, which are commonly used in the MMIC packages for transmitting RF signals, cannot solve the thermal and reliability issues. It is because the microstrips must be constrained in their physical sizes to maintain good frequency response, and such size constraint of the microstrips lead to inferior thermal performance in high frequency and high power applications. It is therefore the objective of the present disclosure to provide a new structure within the MMIC package for transmitting high frequency and high power RF signals.

SUMMARY

The present disclosure relates to a high frequency/high power transition system that includes a monolithic microwave integrated circuit (MMIC) package and a printed-circuit-board (PCB) with a number of first PCB vias. The MMIC package has a laminate-based body, which includes a substrate integrated waveguide (SIW) structure, and a MMIC die over the laminate-based body. The SIW structure is formed from a top metal portion, a bottom metal portion, a dielectric block between the top metal portion and the bottom metal portion, and a number of SIW vias. Each SIW via extends through the dielectric block, and is electrically coupled between the top metal portion and the bottom metal portion. The SIW structure faces the PCB and is separate from the PCB with a gap in between. The SIW structure is configured to transmit radio frequency (RF) signals from the MMIC die to the PCB. Herein, the first PCB vias have a same via number as the SIW vias. An arrangement of the first PCB vias is scaling-mirrored to an arrangement of the SIW vias, such that each first PCB via and a corresponding SIW via have a same relative position. The arrangement of the first PCB vias is about aligned with the arrangement of the SIW vias with a 5 mil offset tolerance.

In one embodiment of the transition system, a size of each SIW via, a number of the SIW vias, and the arrangement of the SIW vias are determined by a distance of the gap and the RF signals to be transmitted.

In one embodiment of the transition system, the top metal portion includes a microstrip region, a trapezoidal region, an output interface region, and two protrusion regions. Herein, the microstrip region is the closest region to the MMIC die in the top metal portion, while the output interface region is the closest region to the PCB in the top metal portion. The top metal portion is symmetrical along a center-line. As such, each of the microstrip region, the trapezoidal region, and the output interface region is symmetrical along a center-line of the top metal portion, and the two protrusion regions are symmetrical to the center-line of the top metal portion. A width of the microstrip region is at least 5 times narrower than a width of the output interface region. The trapezoidal region is connected between the microstrip region and the output interface region with a width increasing from the microstrip region to the output interface region. Each protrusion region protrudes from a periphery of the output interface region towards the MMIC die, and is separate from the trapezoidal region.

In one embodiment of the transition system, the microstrip region is configured to receive the RF signals from the MMIC die, and configured to provide a 50-Ω feedline of the SIW structure. The output interface region with components underneath is configured to radiate the RF signals to the PCB. The trapezoidal region is configured to provide impedance match or wave launch from the microstrip region to the output interface region. The protrusion regions are configured to provide proper grounding for the RF signals.

In one embodiment of the transition system, the number of the SIW vias is ten. Two of the SIW vias are confined within each protrusion region and six of the SIW vias are confined within the output interface region. The six SIW vias include a first via set with three of the SIW vias and a second via set with the other three of the SIW vias. Herein, the first via set and the second via set are symmetrical to the center-line of the top metal portion, and each of the first via set and the second via set is about the periphery of the output interface region.

In one embodiment of the transition system, the PCB further includes a top PCB metal layer, a bottom PCB metal layer, a PCB body between the top PCB metal layer and the bottom PCB metal layer, and a number of second PCB vias. Herein, each first PCB via extends through the PCB body, and is electrically coupled between the top PCB metal layer and the bottom PCB metal layer. Each second PCB via extends through the PCB body, and is electrically coupled between the top PCB metal layer and the bottom PCB metal layer.

In one embodiment of the transition system, the top PCB metal layer includes a receptive interface region, which faces the output interface region of the SIW structure, and a main region away from the SIW structure. The first PCB vias are confined within the receptive interface region, while the second PCB vias are confined within the main region. The second PCB vias are aligned in two lines at a periphery of the main region.

In one embodiment of the transition system, the top PCB metal layer is formed of copper, copper plated with silver, or copper plated with gold, with a thickness between 0.5 mil and 2 mil. The bottom PCB metal layer is formed of copper, copper plated with silver, or copper plated with gold, with a thickness between 0.5 mil and 2 mil. The PCB body is formed of Polytetrafluoroethylene (PTFE), fiberglass, or ceramic, with a thickness between 5 mil and 20 mil. Each first PCB via is a micro hole coated with a conductive material or a metallic cylinder. Each second PCB via is a micro hole coated with a conductive material or a metallic cylinder.

In one embodiment of the transition system, the RF signals are transmitted from the MMIC die to the SIW structure by bonding wires, which are electrically coupled between the MMIC die and the microstrip region of the SIW structure. The RF signals are transmitted from the SIW structure to the PCB by radiation, where the output interface region of the SIW structure faces the PCB.

In one embodiment of the transition system, the top metal portion has a smaller size than the bottom metal portion and does not fully cover the dielectric block underneath, such that portions of the dielectric block are exposed through the top metal portion. The bottom metal portion fully covers the dielectric block above.

In one embodiment of the transition system, the laminate-based body includes a top package metal layer, a bottom package metal layer, a first inner package metal layer, a second inner package metal layer, a first dielectric layer, a second dielectric layer, and a third dielectric layer. Herein, the first dielectric layer is between the top package metal layer and the first inner package metal layer, the second dielectric layer is between the first inner package metal layer and the second inner package metal layer, and the third dielectric layer is between the second inner package metal layer and the bottom package metal layer. The top metal portion of the SIW structure is a portion of the top package metal layer, the bottom metal portion of the SIW structure is a portion of the bottom package metal layer, and the dielectric block of the SIW structure is a combination of a portion of the first dielectric layer, a portion of the second dielectric layer, and a portion of the third dielectric layer. Within an area of the SIW structure, the first inner package metal layer and the second inner package metal layer do not exist.

In one embodiment of the transition system, the MMIC die is mounted on a copper slug, which is embedded in the laminate-based body. The MMIC die is surrounded by the top package metal layer, and exposed through the top package metal layer. The top package metal layer does not fully cover the first dielectric layer, such that portions of the first dielectric layer are exposed through the top package metal layer. The bottom package metal layer extends across a whole horizontal area of the laminate-based body.

In another embodiment, the transition system further includes a ring frame, which has a first ring portion, residing over the MMIC package. Herein, the ring frame has an interior ring opening and an outer ring periphery. The interior ring opening is smaller than an outer package periphery of the MMIC package, and the outer ring periphery is larger than the outer package periphery of the MMIC package, such that a top portion of the MMIC package is exposed through the interior ring opening. The first ring portion bridges between the PCB and the SIW structure of the MMIC package.

In one embodiment of the transition system, the ring frame is attached to the laminate-based body of the MMIC package via a glue material. The first ring portion is connected to the PCB via a solder joint.

In one embodiment of the transition system, the ring frame includes a top ring metal layer, a bottom ring metal layer, a ring body between the top ring metal layer and the bottom ring metal layer, a number of first ring vias, and a number of second ring vias. The first ring vias and the second ring vias are confined within the first ring portion.

In one embodiment of the transition system, each first ring via extends through the ring body and is electrically coupled between the top ring metal layer and the bottom ring metal layer. Each second ring via extends through the ring body and the glue material, and is electrically coupled between the top ring metal layer and the top metal portion of the SIW structure.

In one embodiment of the transition system, the MMIC die is centered at the top portion of the MMIC package, such that the MMIC die is exposed through the interior ring opening of the ring frame. A top portion of the SIW structure is partially exposed through the interior ring opening of the ring frame.

In another embodiment, the transition system further includes a lid, which resides over the ring frame to encapsulate the MMIC die from an external environment.

In another embodiment, the transition system further includes a carrier. Herein, the PCB and MMIC package reside over the carrier. The carrier is a heat sink or a ground plane.

In one embodiment of the transition system, the top metal portion of the SIW structure is formed of copper, copper plated with silver, or copper plated with gold, with a thickness between 0.5 mil and 2 mil. The bottom metal portion of the SIW structure is formed of copper, copper plated with silver, or copper plated with gold, with a thickness between 0.5 mil and 2 mil. The dielectric block of the SIW structure is formed of PTFE, fiberglass, or ceramic, with a thickness between 5 mil and 20 mil. Each SIW via is a micro hole coated with a conductive material or a metallic cylinder.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
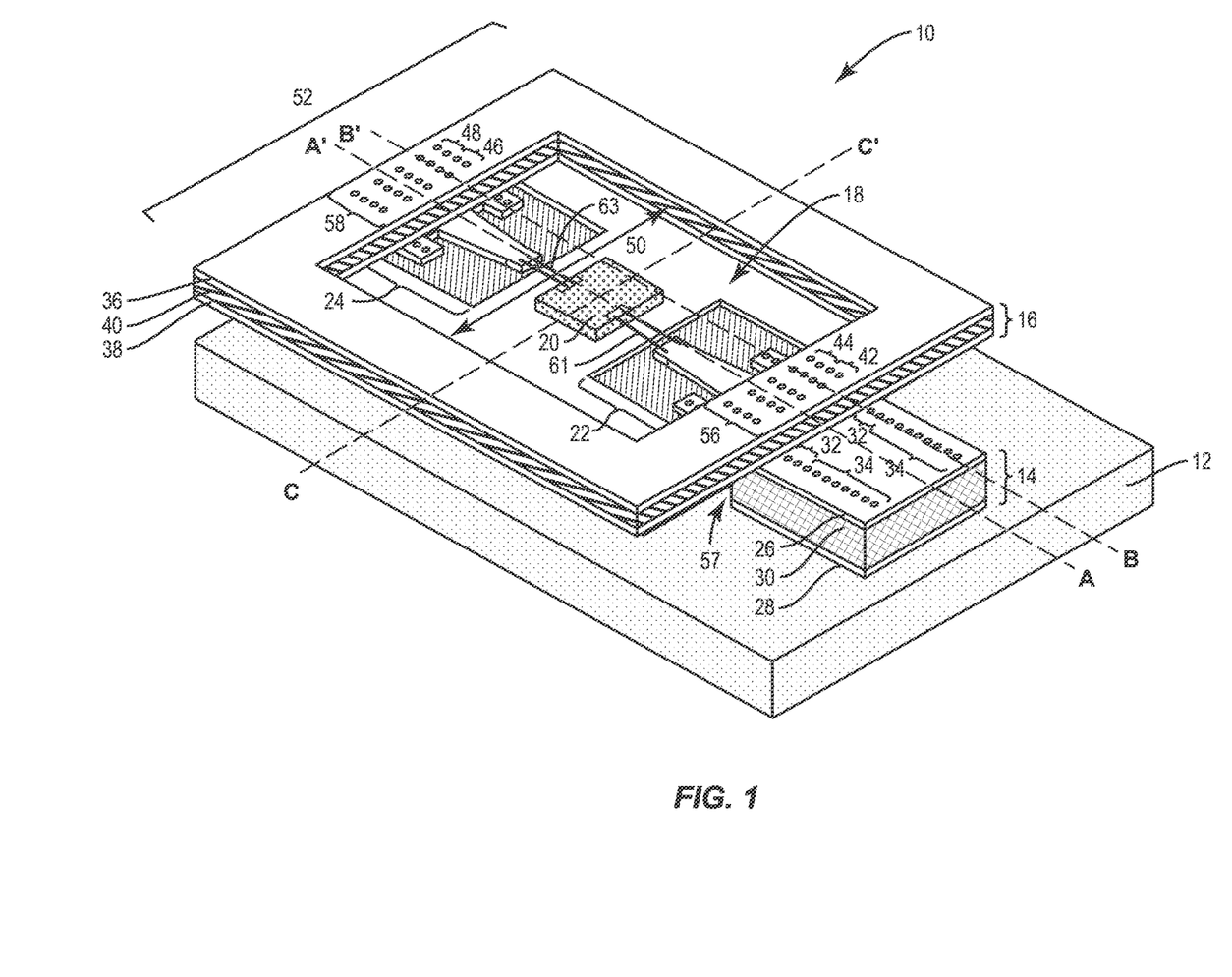
FIG. 1 provides a three-dimension (3D) view of an exemplary transition system according to one embodiment of the present disclosure.
Figure 2:
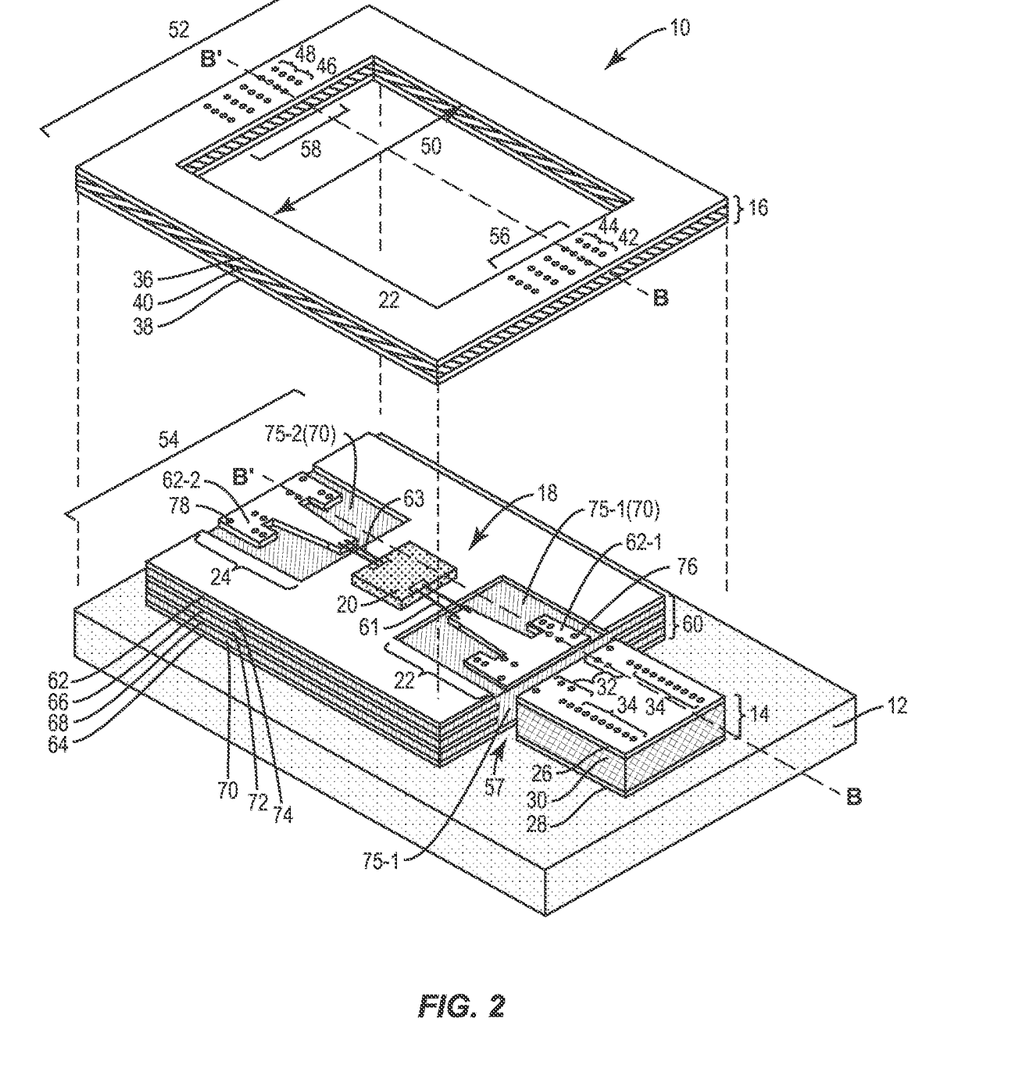
FIG. 2 provides a diagram illustrating different levels of the transition system shown in FIG. 1.

The present disclosure relates to a transition system for high frequency/high power radio frequency (RF) signal receiving/transmitting (at a target operating frequency range of 40-50 GHz). FIG. 1 provides a three-dimension (3D) view of an exemplary transition system 10, while FIG. 2 provides a diagram illustrating different levels of the transition system 10 according to one embodiment of the present disclosure. Notably, components of the transition system 10 are referred to with common element numbers in FIGS. 1 and 2. The transition system 10 includes a carrier 12, a printed-circuit-board (PCB) 14, a ring frame 16, and a monolithic microwave integrated circuit (MMIC) package 18 that has a MMIC die 20, a first substrate integrated waveguide (SIW) structure 22, and a second SIW structure 24. The PCB 14 and the MMIC package 18 reside over the carrier 12, and the ring frame 16 resides over the MMIC package 18.

In detail, the carrier 12 may be adapted to function as a heat sink or adapted to function as a ground plane for the transition system 10. In this manner, the carrier 12 may be formed of copper, aluminum, steel, or the like. The PCB 14 includes a top PCB metal layer 26, a bottom PCB metal layer 28, a PCB body 30 between the top PCB metal layer 26 and the bottom PCB metal layer 28, first PCB vias 32, and second PCB vias 34. Each first PCB via 32 extends through the PCB body 30, and is electrically coupled between the top PCB metal layer 26 and the bottom PCB metal layer 28. Each second PCB via 34 also extends through the PCB body 30, and is electrically coupled between the top PCB metal layer 26 and the bottom PCB metal layer 28. The first PCB vias 32 are arranged to match via locations in the first SIW structure 22 (more details in following descriptions) for direct signal radiation. The second PCB vias 34 may be aligned in two lines at a periphery of the PCB 14. Compared to the second PCB vias 34, the first PCB vias 32 are closer to the MMIC package 18. Herein, the top PCB metal layer 26 may be formed of copper, copper plated with silver, copper plated with gold, or the like, with a thickness between 0.5 mil and 2 mil. The bottom PCB metal layer 28 may be formed of copper, copper plated with silver, copper plated with gold, or the like, with a thickness between 0.5 mil and 2 mil. The PCB body 30 may be formed of Polytetrafluoroethylene (PTFE), fiberglass, ceramic, or the like, with a thickness between 5 mil and 20 mil. Each first/second PCB via 32/34 may be a micro hole coated with a conductive material (such as copper, gold, or the like), or a metallic cylinder.

The ring frame 16 includes a top ring metal layer 36, a bottom ring metal layer 38, a ring body 40 between the top ring metal layer 36 and the bottom ring metal layer 38, first ring vias 42, second ring vias 44, third ring vias 46, and fourth ring vias 48. The top ring metal layer 36 and the bottom ring metal layer 38 may be formed of copper, copper plated with silver, or copper plated with gold, or the like. The ring body 40 may be formed of PTFE, fiberglass, ceramic, or the like. Each first/second/third/fourth ring via 42/44/46/48 may be a micro hole coated with conductive materials (such as copper, gold, or the like), or a metallic cylinder.

The ring frame 16 has an interior ring opening 50 and an outer ring periphery 52. The interior ring opening 50 is smaller than an outer package periphery 54 (shown in FIG. 2) of the MMIC package 18, and the outer ring periphery 52 is larger than the outer package periphery 54. As such, the ring frame 16 is able to reside over the MMIC package 18, and a top portion of the MMIC package 18 is exposed through the interior ring opening 50. A first ring portion 56 of the ring frame 16 bridges between the PCB 14 and the first SIW structure 22 of the MMIC package 18, and crosses a gap 57 between PCB 14 and the MMIC package 18. The gap 57 has a distance between 5 mil and 10 mil. The first ring vias 42 and the second ring vias 44 are confined within the first ring portion 56. Similarly, a second ring portion 58 of the ring frame 16 may bridge between the second SIW structure 24 of the MMIC package 18 and an electronic structure, like another PCB on the carrier 12 (not shown for simplicity). The third ring vias 46 and the fourth ring vias 48 are confined within the second ring portion 58.

Besides the MMIC die 20, the MMIC package 18 also includes a laminate-based body 60 (shown in FIG. 2). The MMIC die 20 resides over the laminate-based body 60 and is centered at the top portion of the MMIC package 18. As such, the MMIC die 20 is exposed through the interior ring opening 50 and surrounded by the ring frame 16. The first SIW structure 22 and the second SIW structure 24 are embedded in the laminate-based body 60, and located at opposite sides of the MMIC die 20. The first SIW structure 22 and the second SIW structure 24 may be identical to each other. The first SIW structure 22 and the second SIW structure 24 are configured to receive or transmit RF signals for the MMIC die 20. The MMIC die 20 is electrically coupled to the first SIW structure 22 and to the second SIW structure 24 through first bonding wires 61 and second bonging wires 63, respectively. In one embodiment, the first SIW structure 22 faces the PCB 14, and is configured to transmit the RF signals from the MMIC die 20 to the PCB 14. Herein, the RF signals are transmitted from the MMIC die 20 to the first SIW structure 22 by the first bonding wires 61, while the RF signals are transmitted from the first SIW structure 22 to the PCB 14 by radiation. The second SIW structure 24 is configured to transmit the RF signal from the electronic structure on the carrier (not shown for simplicity) to the MMIC die 20. A top portion of the first SIW structure 22 and a top portion of the second SIW structure 24 are partially exposed through the interior ring opening 50.

For the purpose of this illustration, the laminate-based body 60 contains a top package metal layer 62, a bottom package metal layer 64, a first inner package metal layer 66, a second inner package metal layer 68, a first dielectric layer 70, a second dielectric layer 72, and a third dielectric layer 74. The first dielectric layer 70 is between the top package metal layer 62 and the first inner package metal layer 66, the second dielectric layer 72 is between the first inner package metal layer 66 and the second inner package metal layer 68, and the third dielectric layer 74 is between the second inner package metal layer 68 and the bottom package metal layer 64. In different applications, the laminate-based body 60 may include more or fewer inner package metal layers, and more or fewer dielectric layers, which may be formed alternatively with the inner package metal layers. The top package metal layer 62 does not fully cover the first dielectric layer 70, such that portions of the first dielectric layer 70 are exposed through the top package metal layer 62. In one embodiment, the MMIC die 20 may be surrounded by the top package metal layer 62. The top package metal layer 62 may be formed of copper, copper plated with silver, copper plated with gold, or the like, with a thickness between 0.5 mil and 2 mil. The bottom package metal layer 64 may be formed of copper, copper plated with silver, copper plated with gold, or the like, with a thickness between 0.5 mil and 2 mil. The first inner package metal layer 66 may be formed of copper, copper plated with silver, copper plated with gold, or the like, with a thickness between 0.5 mil and 2 mil. The second inner package metal layer 68 may be formed of copper, copper plated with silver, copper plated with gold, or the like, with a thickness between 0.5 mil and 2 mil. The first dielectric layer 70 may be formed of laminate core (PTFE, fiberglass, or the like), with a thickness between 2 mil and 10 mil. The second dielectric layer 72 may be formed of laminate prepreg (fiberglass, resin, or the like), with a thickness between 1 mil and 4 mil. The third dielectric layer 74 may be formed of laminate core (PTFE, fiberglass, or the like), with a thickness between 2 mil and 10 mil.

Within the area of the first SIW structure 22, the first inner package metal layer 66 and the second inner package metal layer 68 are evacuated. As such, a portion of the first dielectric layer 70, a portion of the second dielectric layer 72, and a portion of the third dielectric layer 74 are merged as a first dielectric block 75-1 between the top package metal layer 62 and the bottom package metal layer 64. Similarly, within the area of the second SIW structure 24, the first inner package metal layer 66 and the second inner package metal layer 68 are evacuated. As such, another portion of the first dielectric layer 70, another portion of the second dielectric layer 72, and another portion of the third dielectric layer 74 are merged as a second dielectric block 75-2 between the top package metal layer 62 and the bottom package metal layer 64.

Figure 3A:
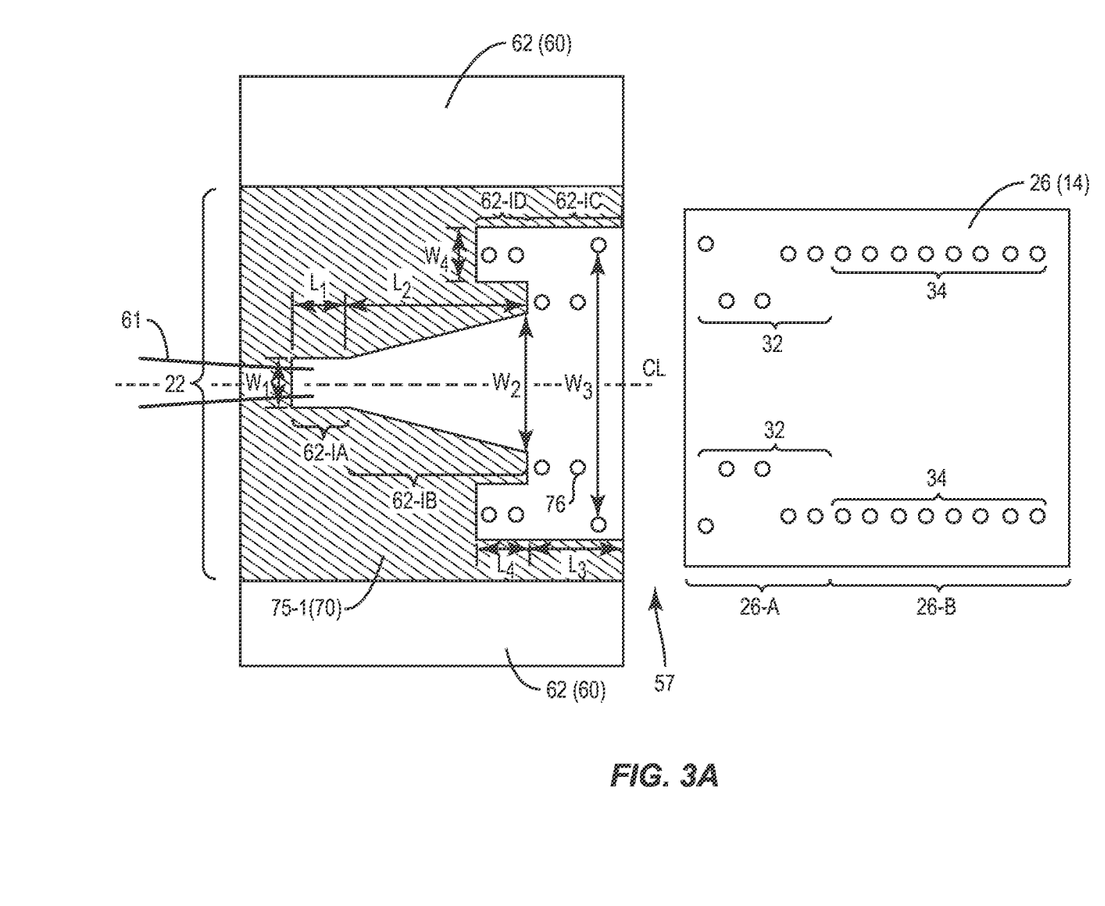
FIGS. 3A-3B provide top and bottom views of a SIW structure included in the transition system shown in FIG. 2.
Figure 3B:
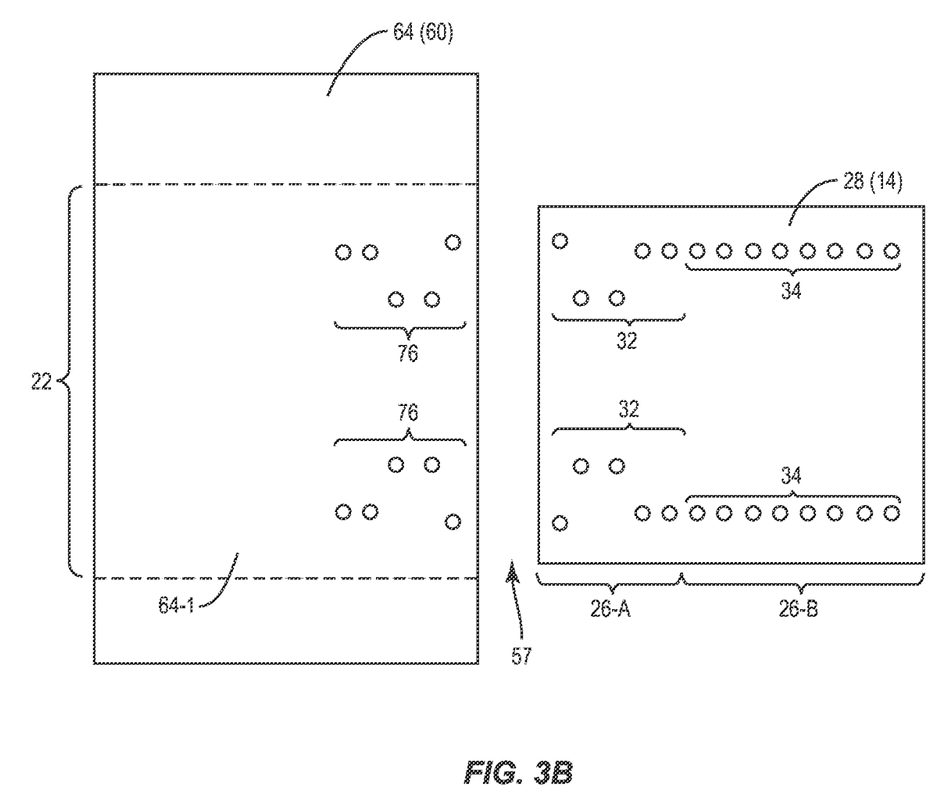

The first SIW structure 22 is composed by a first top metal portion 62-1 of the top package metal layer 62, a first bottom portion 64-1 of the bottom package metal layer 64, the first dielectric block 75-1 in between, and a number of first SIW vias 76 (only one first SIW via 76 is labeled with a reference number for clarity), as illustrated in FIGS. 3A and 3B. The second SIW structure 24 may have a same configuration as the first SIW structure 22. FIGS. 3A and 3B provide top and bottom views, respectively, of the first SIW structure 22.

In some applications, the first top metal portion 62-1 of the top package metal layer 62 may be isolated from other portions of the top package metal layer 62. In some applications, the first top metal portion 62-1 of the top package metal layer 62 may be continuous with the other portions of the top package metal layer 62 at areas where the first SIW vias 76 are located (not shown). Herein, the first top metal portion 62-1 includes a microstrip region 62-1A, a trapezoidal region 62-1B, an output interface region 62-1C, and two protrusion regions 62-1D. The microstrip region 62-1A is the closest region to the MMIC die 20 in the first top metal portion 62-1, while the output interface region 62-1C is the closest region to the PCB 14 in the first top metal portion 62-1. The first top metal portion 62-1 is symmetrical along a center-line (CL). Each of the microstrip region 62-1A, the trapezoidal region 62-1B, and the output interface region 62-1C are symmetrical along the CL of the first top metal portion 62-1. The two protrusion regions 62-1D are symmetrical to the CL of the first top metal portion 62-1. A width $W_1$ of the microstrip region 62-1A may be at least 5 times narrower than a width $W_3$ of the output interface region 62-1C. The trapezoidal region 62-1B is connected between the microstrip region 62-1A and the output interface region 62-1C, and has a width $W_2$ increasing from the microstrip region 62-1A to the output interface region 62-1C. Each protrusion region 62-1D protrudes from the periphery of the output interface region 62-1C towards the MMIC die 20, and is separate from the trapezoidal region 62-1B.

Herein, the microstrip region 62-1A is configured to receive the RF signals from the MMIC die 20 through the first bonding wires 61, and configured to provide a 50-Ω feedline of the first SIW structure 22. The output interface region 62-1C with components underneath (a portion of the dielectric block 75-1 underneath, some first SIW vias 76, and a portion of the first bottom portion 64-1 underneath) is configured to radiate the RF signals to the PCB 14. The trapezoidal region 62-1B connected between the microstrip region 62-1A and the output interface region 62-1C is configured to provide impedance match and/or wave launch from the microstrip region 62-1A to the output interface region 62-1C. The protrusion regions 62-1D are configured to provide proper grounding for the RF signals within the first SIW structure 22.

The first SIW vias 76 are used to guide the RF signals within the first SIW structure 22. The size of each first SIW via 76, the numbers of the first SIW vias 76, and an arrangement of the first SIW vias 76 are determined by the distance of the gap 57 and the RF signals that need to be transmitted. In one embodiment, the first SIW structure 22 includes ten first SIW vias 76, each of which extends through the first dielectric block 75-1 and is electrically coupled between the first top metal portion 62-1 and the first bottom portion 64-1. Two of the first SIW vias 76 are confined within each protrusion region 62-1D and six of the first SIW vias 76 are confined within the output interface region 62-1C. The six first SIW vias 76 include a first via set with three of the first SIW vias 76 and a second via set with the other three of the first SIW vias 76. Herein, the first via set and the second via set are symmetrical to the CL of the first top metal portion 62-1, and each via set is about the periphery of the output interface region 62-1C. Each first SIW via 76 may be a micro hole coated with conductive materials (such as copper, gold, or the like), or a metallic cylinder.

In this embodiment, the PCB 14 includes ten first PCB vias 32, which are confined within a receptive interface region 26-A of the top PCB metal layer 26. The receptive interface region 26-A faces the output interface region 62-1C of the first top metal portion 62-1. In order to get direct signal radiation between the first SIW structure 22 and the PCB 14, an arrangement of the first PCB vias 32 within the receptive interface region 26-A is scaling-mirrored to an arrangement of the first SIW vias 76 within the output interface region 62-1C. As such, each first PCB via 32 and a corresponding first SIW via 76 have a same relative position. In some applications, the arrangement of the first PCB vias 32 is identical-mirrored to the arrangement of the first SIW vias 76. The arrangement of the first PCB vias 32 is about aligned with the arrangement of the first SIW vias 76 (with a 5 mil offset tolerance). In addition, the PCB 14 also includes sixteen second PCB vias 34, which are confined within a main region 26-B of the top PCB metal layer 26. The second PCB vias 34 may be aligned in two lines at a periphery of the main region 26-B.

In a traditional MMIC package, microstrips are commonly used for signal transmitting. To maintain good frequency response, the microstrips must be constrained in their physical sizes (i.e. a width similar to the width $W_1$ of the microstrip region 62-1A). However, the constrained physical sizes of the microstrips lead to their very high temperature (inferior reliability) in high frequency and high power applications. Compared to the conventional microstrips, the first top metal portion 62-1 used in in first SIW structure 22 has a much larger metal size (with a same length). Therefore, the first SIW structure 22 is allowed for more power handling mainly due to the size increase in conductive metal along the signal transmitting (input/output) path.

Figure 4A:
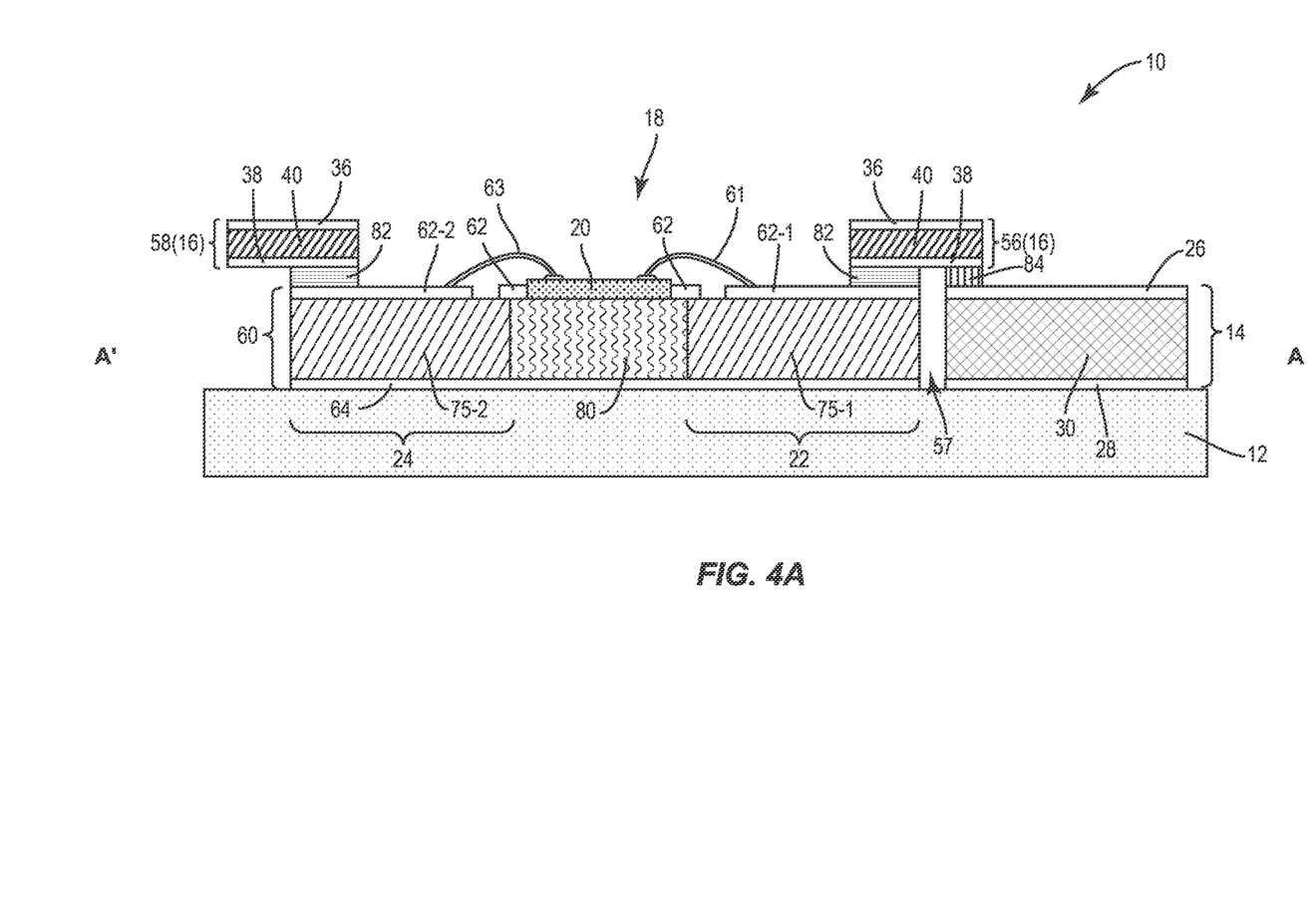
FIGS. 4A-4C provide cross-sectional views of the transition system shown in FIG. 1.
Figure 4B:
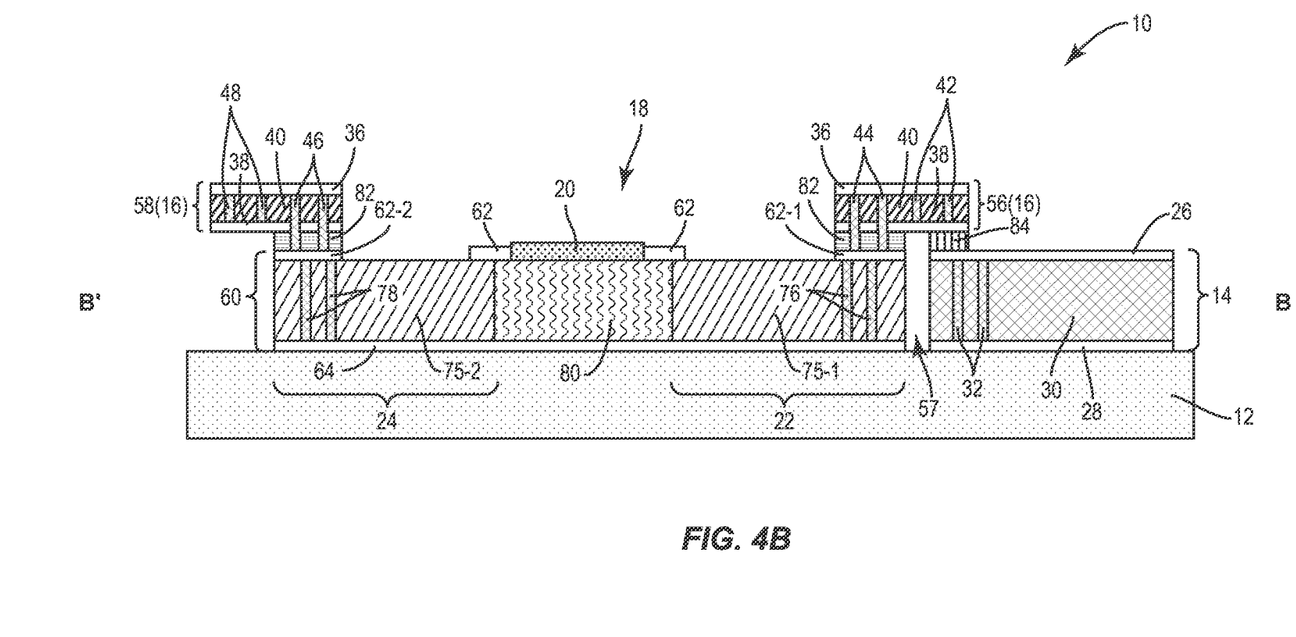
Figure 4C:
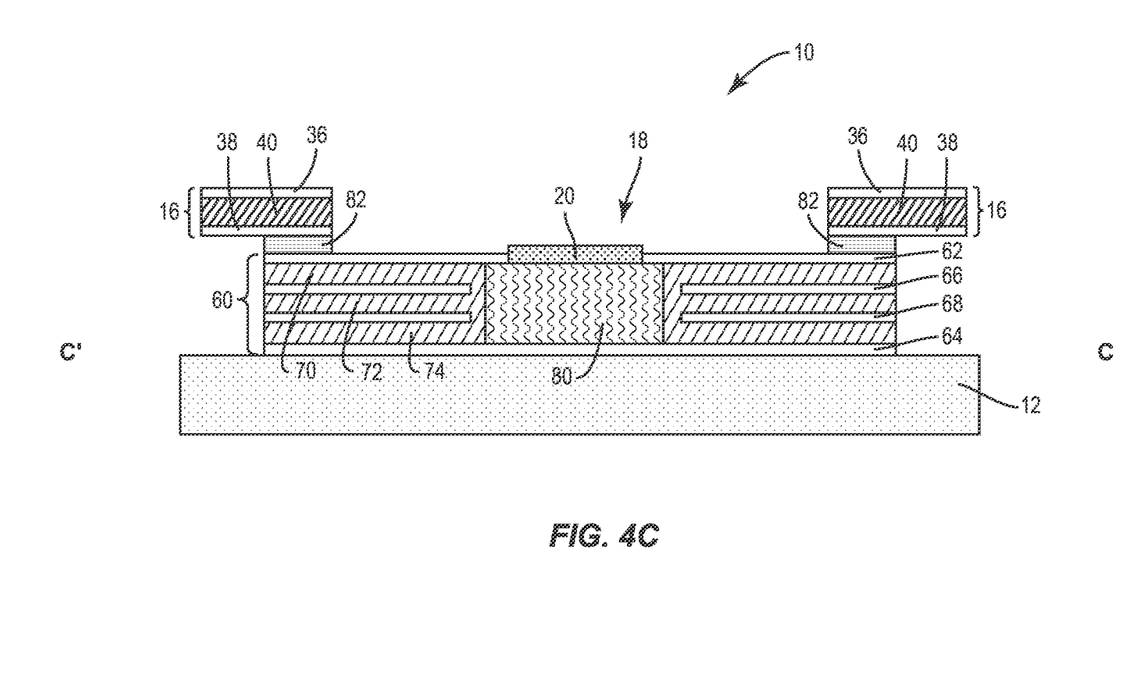

FIGS. 4A-4C provide cross-sectional views of the transition system 10 shown in FIG. 1. FIG. 4A is a cross-sectional view along a dashed-line A-A'. The MMIC die 20 is mounted on a copper slug 80, which is embedded in the laminate-based body 60. The ring frame 16 is attached to the laminate-based body 60 via a glue material 82, such as epoxy resin. The glue material 82 is between the bottom ring metal layer 38 and the top package metal layer 62. The first ring portion 56 of the ring frame 16 spans the gap 57 between the PCB 14 and the first SIW structure 22. The first ring portion 56 is connected to the PCB 14 via a solder joint 84. The solder joint 84 is between the bottom ring metal layer 38 and the top PCB metal layer 26. Similarly, the second ring portion 58 may be connected to the electronic structure on the carrier (not shown for simplicity) via a solder joint.

FIG. 4B is a cross-sectional view along a dashed-line B-B'. The first ring vias 42 are confined in the first ring portion 56, each of which extends through the ring body 40 and is electrically coupled between the top ring metal layer 36 and the bottom ring metal layer 38. The second ring vias 44 are also confined in the first ring portion 56, each of which extends through the ring body 40 and the glue material 82, and is electrically coupled between the top ring metal layer 36 and the first top metal portion 62-1 of the top package metal layer 62. The third ring vias 46 are confined in the second ring portion 58, each of which extends through the ring body 40 and the glue material 82, and is electrically coupled between the top ring metal layer 36 and the second top metal portion 62-2 of the top package metal layer 62. The fourth ring vias 48 are also confined in the second ring portion 58, each of which extends through the ring body 40 and is electrically coupled between the top ring metal layer 36 and the bottom ring metal layer 38. Note that the first ring portion 56 is not used for the RF signals transmitted between the first SIW structure 22 and the PCB 14, but is only used for grounding both the top package metal layer 62 and the top PCB metal layer 26 (similar to the second ring portion 58). The RF signals are transmitted between the first SIW structure 22 and the PCB 14 by radiation.

In addition, each first SIW via 76 extends through the first dielectric block 75-1, and is electrically coupled between the first top metal portion 62-1 and the bottom package metal layer 64. Each second SIW via 78 extends through the second dielectric block 75-2, and is electrically coupled between the second top metal portion 62-2 and the bottom package metal layer 64. It is clear that, within the areas of the first SIW structure 22 and the second SIW structure 24, there is no inner package metal layer (66/68) within the first and second dielectric blocks 75-1, 75-2. Each first SIW via 76 and each second SIW via 78 do not extend through any inner package metal layer (66/68) between the top package metal layer 62 and the bottom package metal layer 64.

FIG. 4C is a cross-sectional view along a dashed-line C-C'. Outside the areas of the first SIW structure 22 and the second SIW structure 24, the laminate-based body 60 includes the first inner package metal layer 66 and the second inner package metal layer 68, which are alternating with the dielectric layers 70, 72, and 74. None of the top package metal layer 62, the first inner package metal layer 66, and the second inner package metal layer 68 extends across the whole horizontal area of the laminate-based body 60, while the bottom package metal layer 64 extends across the whole horizontal area of the laminate-based body 60.

Figure 5:
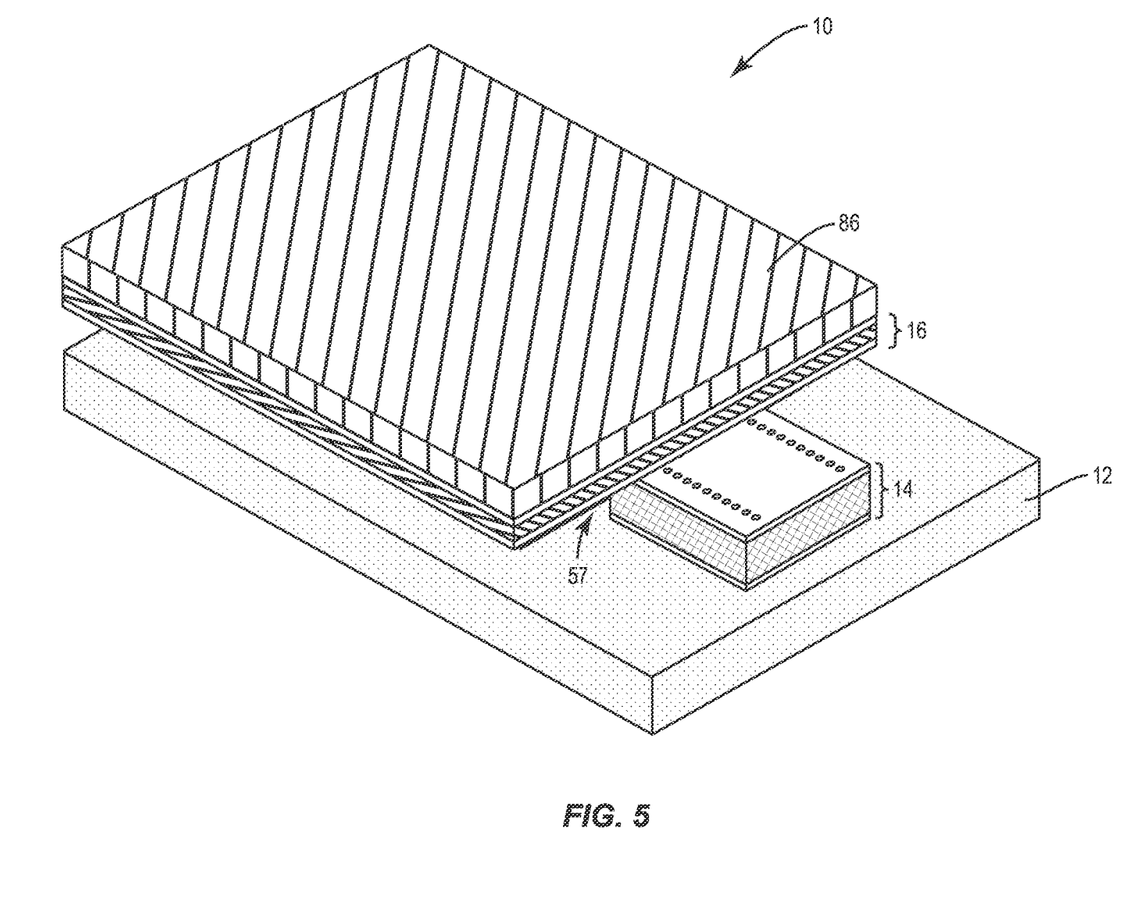
FIG. 5 provides a 3D view of an exemplary transition system with a lid.
Figure 6:
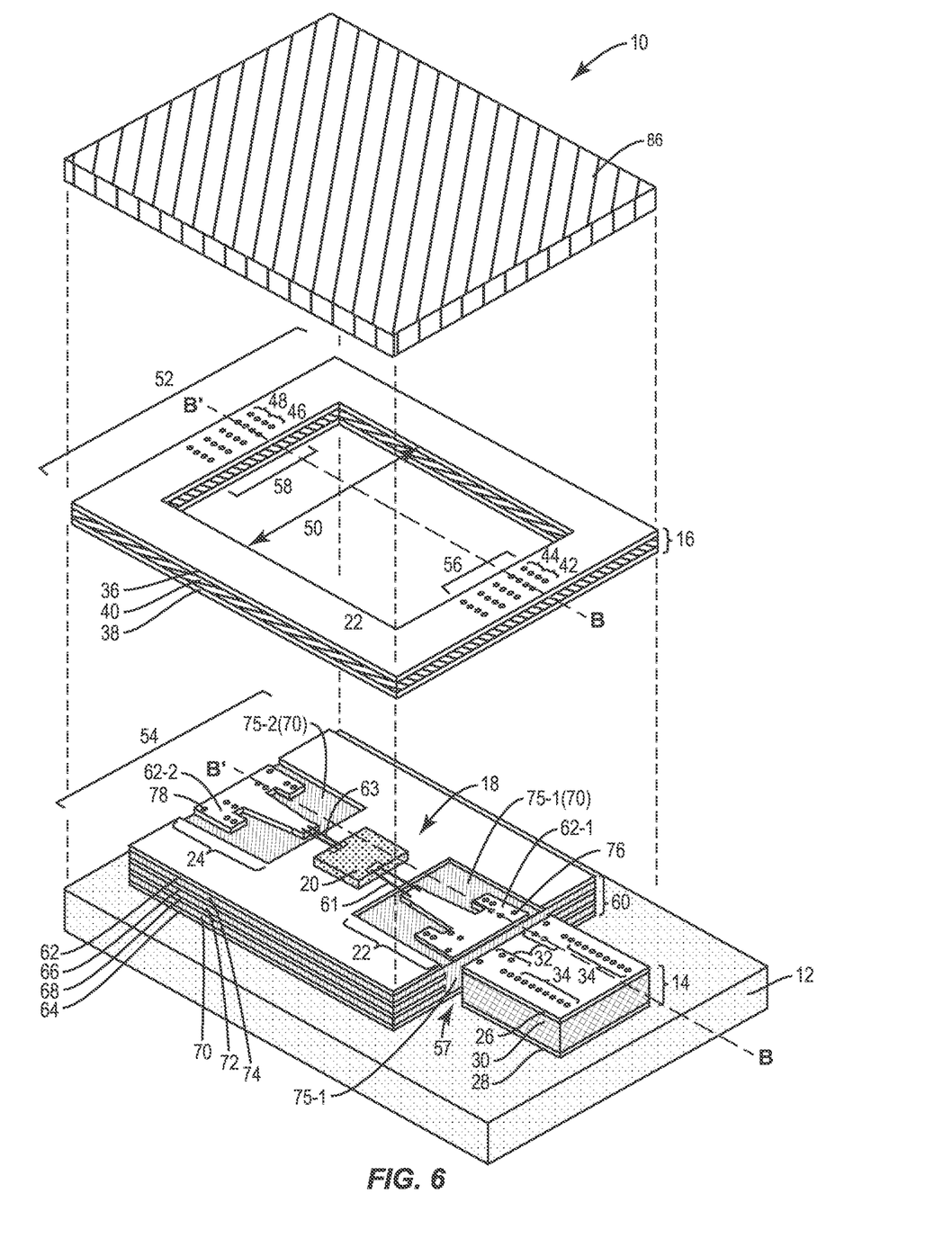
FIG. 6 provides a diagram illustrating different levels of the transition system shown in FIG. 5.

In some applications, the transition system 10 may further include a lid, as illustrated in FIGS. 5 and 6. FIG. 5 provides the transition system 10 with a lid 86, while FIG. 6 provides a diagram illustrating different levels of the transition system 10 shown in FIG. 5. The lid 86 resides over the ring frame 16 to encapsulate the MMIC die 20 from an external environment. The lid 86 may be formed of plastic, ceramic, or the like.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a printed-circuit-board (PCB) with a plurality of first PCB vias; and
a monolithic microwave integrated circuit (MMIC) package including a laminate-based body and a MMIC die over the laminate-based body, wherein:
the laminate-based body, which is separated from the PCB, includes a substrate integrated waveguide (SIW) structure, which is formed from a top metal portion, a bottom metal portion, a dielectric block between the top metal portion and the bottom metal portion, and a plurality of SIW vias, wherein each of the plurality of SIW vias extends through the dielectric block, and is electrically coupled between the top metal portion and the bottom metal portion;
the SIW structure faces the PCB and is separate from the PCB with a gap in between, wherein the SIW structure is configured to transmit radio frequency (RF) signals from the MMIC die to the PCB;
the plurality of first PCB vias has a same via number as the plurality of SIW vias, wherein an arrangement of the plurality of first PCB vias is scaling-mirrored to an arrangement of the plurality of SIW vias, such that each of the plurality of first PCB vias and a corresponding SIW via have a same relative position; and
the arrangement of the plurality of first PCB vias is about aligned with the arrangement of the plurality of SIW vias with a 5 mil offset tolerance.

2. The apparatus of claim 1 wherein the top metal portion includes a microstrip region, a trapezoidal region, an output interface region, and two protrusion regions, wherein:
the microstrip region is the closest region to the MMIC die in the top metal portion, while the output interface region is the closest region to the PCB in the top metal portion;
the top metal portion is symmetrical along a center-line, such that each of the microstrip region, the trapezoidal region, and the output interface region is symmetrical along a center-line of the top metal portion, and the two protrusion regions are symmetrical to the center-line of the top metal portion;
a width of the microstrip region is at least 5 times narrower than a width of the output interface region;
the trapezoidal region is connected between the microstrip region and the output interface region with a width increasing from the microstrip region to the output interface region; and
each protrusion region protrudes from a periphery of the output interface region towards the MMIC die, and is separate from the trapezoidal region.

3. The apparatus of claim 2 wherein:
the microstrip region is configured to receive the RF signals from the MMIC die, and configured to provide a 50 ohm, (Ω) feedline of the SIW structure;
the output interface region with components underneath is configured to radiate the RF signals to the PCB;
the trapezoidal region is configured to provide impedance match or wave launch from the microstrip region to the output interface region; and
the two protrusion regions are configured to provide proper grounding for the RF signals within the SIW structure.

4. The apparatus of claim 2 wherein:
the plurality of SIW vias includes ten SIW vias;
two of the plurality of SIW vias are confined within each protrusion region, and six of the plurality of SIW vias are confined within the output interface region; and
the six of the plurality of SIW vias include a first via set with three of the plurality of SIW vias and a second via set with the other three of the plurality of SIW vias, wherein the first via set and the second via set are symmetrical to the center-line of the top metal portion, and each of the first via set and the second via set is about the periphery of the output interface region.

5. The apparatus of claim 2 wherein the PCB further includes a top PCB metal layer, a bottom PCB metal layer, a PCB body between the top PCB metal layer and the bottom PCB metal layer, and a plurality of second PCB vias, wherein:
each of the plurality of first PCB vias extends through the PCB body, and is electrically coupled between the top PCB metal layer and the bottom PCB metal layer; and
each of the plurality of second PCB vias extends through the PCB body, and is electrically coupled between the top PCB metal layer and the bottom PCB metal layer.

6. The apparatus of claim 5 wherein:
the top PCB metal layer includes a receptive interface region, which faces the output interface region of the SIW structure, and a main region away from the SIW structure;
the plurality of first PCB vias are confined within the receptive interface region, while the plurality of second PCB vias are confined within the main region; and
the plurality of second PCB vias are aligned in two lines at a periphery of the main region.

7. The apparatus of claim 5 wherein:
the top PCB metal layer is formed of copper, copper plated with silver, or copper plated with gold, with a thickness between 0.5 mil and 2 mil;
the bottom PCB metal layer is formed of copper, copper plated with silver, or copper plated with gold, with a thickness between 0.5 mil and 2 mil;
the PCB body is formed of Polytetrafluoroethylene (PTFE), fiberglass, or ceramic, with a thickness between 5 mil and 20 mil.
each of the plurality of first PCB vias is a micro hole coated with a conductive material or a metallic cylinder; and
each of the plurality of second PCB vias is a micro hole coated with a conductive material or a metallic cylinder.

8. The apparatus of claim 2 wherein:
the RF signals are transmitted from the MMIC die to the SIW structure by bonding wires, which are electrically coupled between the MMIC die and the microstrip region of the SIW structure; and
the RF signals are transmitted from the SIW structure to the PCB by radiation, wherein the output interface region of the SIW structure faces the PCB.

9. The apparatus of claim 1 wherein:
the top metal portion has a smaller size than the bottom metal portion and does not fully cover the dielectric block underneath, such that portions of the dielectric block are exposed through the top metal portion; and the bottom metal portion fully covers the dielectric block above.

10. The apparatus of claim 1 wherein the laminate-based body includes a top package metal layer, a bottom package metal layer, a first inner package metal layer, a second inner package metal layer, a first dielectric layer, a second dielectric layer, and a third dielectric layer, wherein:

the first dielectric layer is between the top package metal layer and the first inner package metal layer, the second dielectric layer is between the first inner package metal layer and the second inner package metal layer, and the third dielectric layer is between the second inner package metal layer and the bottom package metal layer;

the top metal portion of the SIW structure is a portion of the top package metal layer, the bottom metal portion of the SIW structure is a portion of the bottom package metal layer, and the dielectric block of the SIW structure is a combination of a portion of the first dielectric layer, a portion of the second dielectric layer, and a portion of the third dielectric layer; and within an area of the SIW structure, the first inner package metal layer and the second inner package metal layer do not exist.

11. The apparatus of claim 10 wherein:

the MMIC die is mounted on a copper slug, which is embedded in the laminate-based body;

the MMIC die is surrounded by the top package metal layer, and exposed through the top package metal layer;

the top package metal layer does not fully cover the first dielectric layer, such that portions of the first dielectric layer are exposed through the top package metal layer; and the bottom package metal layer extends across a whole horizontal area of the laminate-based body.

12. The apparatus of claim 1 further comprising a ring frame, which includes a first ring portion, residing over the MMIC package, wherein:

the ring frame has an interior ring opening and an outer ring periphery;

the interior ring opening is smaller than an outer package periphery of the MMIC package, and the outer ring periphery is larger than the outer package periphery of the MMIC package, such that a top portion of the MMIC package is exposed through the interior ring opening; and the first ring portion bridges between the PCB and the SIW structure of the MMIC package.

13. The apparatus of claim 12 wherein:

the ring frame is attached to the laminate-based body of the MMIC package via a glue material; and the first ring portion is connected to the PCB via a solder joint.

14. The apparatus of claim 13 wherein:

the ring frame includes a top ring metal layer, a bottom ring metal layer, a ring body between the top ring metal layer and the bottom ring metal layer, a plurality of first ring vias, and a plurality of second ring vias; and the plurality of first ring vias and the plurality of second ring vias are confined within the first ring portion.

15. The apparatus of claim 14 wherein:

each of the plurality of first ring vias extends through the ring body and is electrically coupled between the top ring metal layer and the bottom ring metal layer; and each of the plurality of second ring vias extends through the ring body and the glue material, and is electrically coupled between the top ring metal layer and the top metal portion of the SIW structure.

16. The apparatus of claim 12 wherein:

the MMIC die is centered at the top portion of the MMIC package, such that the MMIC die is exposed through the interior ring opening of the ring frame; and a top portion of the SIW structure is partially exposed through the interior ring opening of the ring frame.

17. The apparatus of claim 12 further comprising a lid, which resides over the ring frame to encapsulate the MMIC die from an external environment.

18. The apparatus of claim 1 further comprising a carrier, wherein:

the PCB and MMIC package reside over the carrier; and the carrier is a heat sink or a ground plane.

19. The apparatus of claim 1 wherein:

the top metal portion of the SIW structure is formed of copper, copper plated with silver, or copper plated with gold, with a thickness between 0.5 mil and 2 mil;

the bottom metal portion of the SIW structure is formed of copper, copper plated with silver, or copper plated with gold, with a thickness between 0.5 mil and 2 mil;

the dielectric block of the SIW structure is formed of PTFE, fiberglass, or ceramic, with a thickness between 5 mil and 20 mil; and each of the plurality of SIW vias is a micro hole coated with a conductive material, or a metallic cylinder, wherein the conductive material is copper or gold.

20. The apparatus of claim 1 wherein a size of each of the plurality of SIW vias, a number of the plurality of SIW vias, and the arrangement of the plurality of SIW vias are determined by a distance of the gap and the RF signals to be transmitted.

21. The apparatus of claim 1 wherein the arrangement of the plurality of first PCB vias is identical-mirrored to the arrangement of the plurality of SIW vias.

* * * * *